United States Patent [19]
Noftsker et al.

[11] 4,039,928
[45] Aug. 2, 1977

[54] ELECTRICAL OPERATING CIRCUIT HAVING SEMICONDUCTOR DEVICE JUNCTION TEMPERATURE MONITORING

[75] Inventors: Russell Noftsker, Woodland Hills; James Kirk Mathews, Van Nuys, both of Calif.

[73] Assignee: Pertron Controls Corporation, Van Nuys, Calif.

[21] Appl. No.: 706,608

[22] Filed: July 19, 1976

[51] Int. Cl.$^2$ .................. G05D 23/24; H05B 1/02
[52] U.S. Cl. ................................. 323/19; 219/494;
219/499; 219/501; 323/22 SC; 323/40; 323/68;
340/233; 361/103
[58] Field of Search .................. 73/362 SC; 219/494,
219/497, 499, 501, 510; 307/278, 296, 297, 310;
323/15, 16, 19, 22 SC, 34, 40, 68, 75 E; 340/227
R, 228 R, 233; 361/103

[56] References Cited
U.S. PATENT DOCUMENTS

| | | | |
|---|---|---|---|
| 3,546,568 | 12/1970 | Groom et al. | 323/19 |
| 3,622,849 | 11/1971 | Kelley et al. | 323/16 X |
| 3,882,728 | 5/1975 | Wittlinger | 73/362 SC |
| 3,896,369 | 7/1975 | Nakata | 323/19 |
| 3,920,955 | 11/1975 | Nakata | 323/19 X |
| 3,959,621 | 5/1976 | Nakata | 219/494 X |
| 4,001,649 | 1/1977 | Young | 323/68 X |

*Primary Examiner*—A. D. Pellinen
*Attorney, Agent, or Firm*—Ralph M. Braunstein

[57] ABSTRACT

An operating circuit for a semiconductor switch device of the type that passes electrical current from a source to an electrical load by forward biasing of the semiconductor's control terminal includes a resistance bridge network having in an arm thereof the control terminal to one main terminal circuit of the semiconductor switch, and a bias control for alternately applying forward bias and reverse bias to the control terminal through the bridge network, whereby a voltage is developed across the bridge output during the interval in which the control terminal is reverse biased that is representative of the junction temperature within the semiconductor. The temperature representative voltage is observed, monitored, and used for indication and control. In a further embodiment the bias control operates periodically and includes inhibit means responsive to the derived temperature representative voltage exceeding a certain level, representative of a temperature maximum, for retaining the control terminal of the semiconductor in the back biased condition, until the derived voltage reduces in level thereby protecting the semiconductor from thermal burn-out. In a welding control circuit presented herein the foregoing bias control is adapted in an intra-phase control circuit.

48 Claims, 15 Drawing Figures

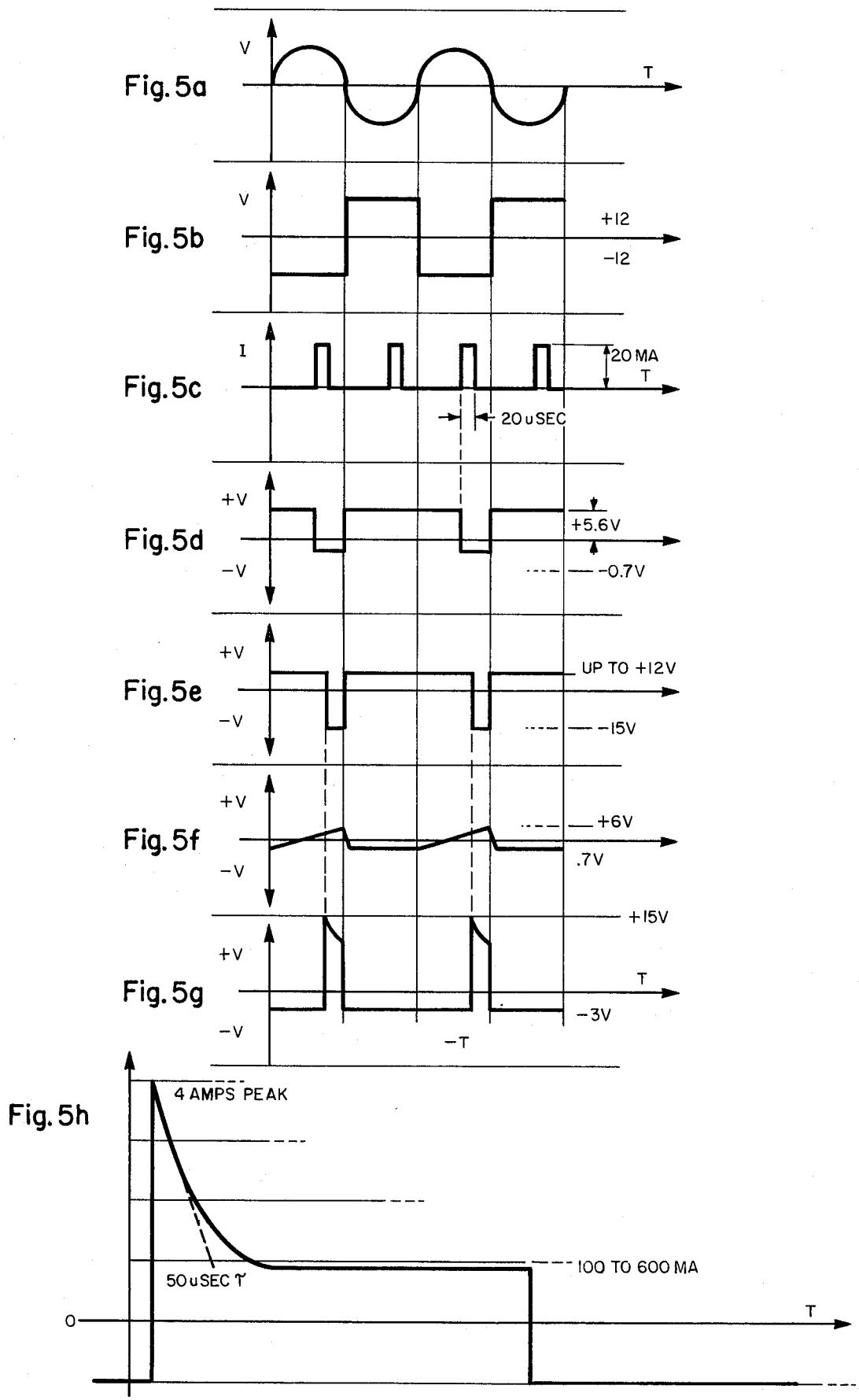

ELECTRICAL OPERATING CIRCUIT HAVING SEMICONDUCTOR DEVICE JUNCTION TEMPERATURE MONITORING

FIELD OF THE INVENTION

The present invention relates to electrical operating circuits having semiconductor device load current switching with temperature control, protection, and indication of the semiconductor device. The invention also relates to novel operating and control circuits for high current apparatus, such as electrical resistance welding machines, having thyristor load current switching.

BACKGROUND OF THE INVENTION

Semiconductor devices, such as thyristors, have long been used as switches in high current electrical circuits to open or close a current conducting path between a source of current and an electrical load under control of associated operating circuitry which provides the appropriate command signals to the control or gate input terminal of the semiconductor device. A resistance welding circuit is one typical example of such a high current electrical load and the familiar resistance welder is one type of device in which such semiconductor device has been employed.

The ability of a particular semiconductor to conduct electrical current is not unlimited. The current or power handling capability of the semiconductor is limited by the phenomena of self-heating: when the temperature of the substrate or chip from which the semiconductor is fabricated becomes excessive, the semiconductor is permanently destroyed. To prevent such failures at present limiters and controls are provided in the associated electrical circuitry, particularly in those applications where the semiconductors are expensive, over a hundred dollars apiece, and are thus not easily replaced. Those existing limiters and controls employ either open loop design heat sinks, or slow response time closed loop limiters, which are known to those skilled in the art.

Both techniques are critically sensitive to overload induced thermal self-destruction. Common closed loop semiconductor temperature limiters employ bi-metallic temperature sensitive switches, thermistors and other electrical or mechanical devices mounted externally on the pack or case, which contains the semiconductor chip, to sense over-temperature. The resulting signals sensed are included in a feedback circuit to exert a control function to inhibit further self-heating operation of the semiconductor.

An obvious disadvantage of such existing technique is that the thermal sensors are physically remote from the substrate or chip in which the heating occurs and the heat must be transferred from the semiconductor chip through the case to the sensor. The limited thermal conductivity of the heat transfer path and the thermal "lag" or delay in detecting the heating limits the ability of those protection circuits to respond in a timely manner to save the semiconductor from destruction. Effectively the design of existing overheat limiting circuitry to handle fault conditions becomes a compromise between cost and complexity and the fault level at which the semiconductor is permitted to be destroyed.

OBJECTS OF THE INVENTION

Thus an object of the present invention is to provide a thermal protection circuit for a semiconductor that avoids the thermal lag inherent in previous limiting and protection devices and which can respond quickly enough to save the semiconductor from all excessive self-heating, except instantaneous first cycle heating. Another object is to provide operating circuitry for semiconductor devices by means of which the temperature of the semiconductor junction may be precisely controlled and limited with sufficient speed and accuracy and permit all other forms of thermal fault and current fault limiters to be discarded. In a broader perspective, a further object of the invention is to sense in a semiconductor operating circuit the temperature of the semiconductor junction, without a thermal case sensor, and to use such sensed information for direct indication, power limiting, control or measurement, and to replace fusing. And in a more specific sense a further object of the invention is to provide an improved control circuit for a resistance welding machine.

SUMMARY OF THE INVENTION

The invention is broadly characterized with a semiconductor switching device such as a thyristor, which has its two main current-conducting terminals in series with a source of power and an electrical load by means of which current flows when the semiconductor control or gate terminal, as variously termed, is forward biased by a suitable voltage; and a resistance bridge network having in one arm thereof the control terminal to one main terminal of the semiconductor, such as the gate to cathode terminals of a thyristor, and means for applying a first polarity voltage to the bridge input for forward biasing the control terminal and, alternately, for applying an opposite polarity voltage to the bridge input for reverse biasing the control terminal of the semiconductor, whereby a voltage is derived across the output of the resistance bridge network during the time that the control terminal is back baised, which voltage is representative of the junction temperature of the semiconductor. With the control terminal forward biased, the circuit functions to permit the semiconductor to pass current to the load and with the control terminal reverse biased, an essentially direct indication of semiconductor junction temperature is obtained during the time period in which the semiconductor is not conducting current to the load.

In another aspect of the invention, means are provided that prevents the aforedescribed means from applying forward bias to the bridge input responsive to the temperature representative output voltage exceeding a predetermined level to thereby prevent further heating of the semiconductor.

Further, an invention for a resistance welding machine described herein is characterized by a thyristor having its anode and cathode connected in series with an AC source and an electrical load and its gate to cathode connected as one arm of a four arm resistance bridge network provided; firing circuit means is connected to the bridge input to provide normally a reverse bias voltage to the gate via the bridge and to provide a forward biasing voltage thereto periodically to trigger the thyristor; and means for preventing the firing circuit means from supplying the forward bias responsive to the bridge output voltage exceeding a predetermined level. In a further aspect of the foregoing invention, the load power is regulated by a phase control of the semiconductor operation.

More specifically, flip-flop type multivibrator means having two bistable stages has an output coupled to the input of the firing circuit means through an inhibit switch means for triggering the firing circuit when in the first bistable state. Ramp voltage generator means is provided which generates a voltage having a ramplike waveshape synchronized with the phase of the AC source coupled to the electrical load. The output of the ramp generator means and the output of the resistance bridge are compared in a voltage comparator means and the output of the voltage comparator means is coupled to the inhibit switch means for activating the inhibit means to prevent the output of the flip-flop from activating the firing circuit means until the ramp voltage attains a predetermined level in relation to the temperature representative bridge output voltage.

The foregoing objects and advantages of the invention, as well as additional objects and advantages, and the more detailed structure characteristic of the invention and equivalents for such structure is more easily understood by giving thoughtful study to the detailed description of the preferred embodiments of the invention, which follows, and to the illustrations thereof presented in the figures of the drawings.

BRIEF DESCRIPTION OF THE DRAWINGS

In the drawings:

FIGS. 5a –5h illustrate some of the voltages and their waveshapes appearing in the embodiment of FIG. 4.

DESCRIPTION OF THE PREFERRED EMBODIMENTS

Figure 1:
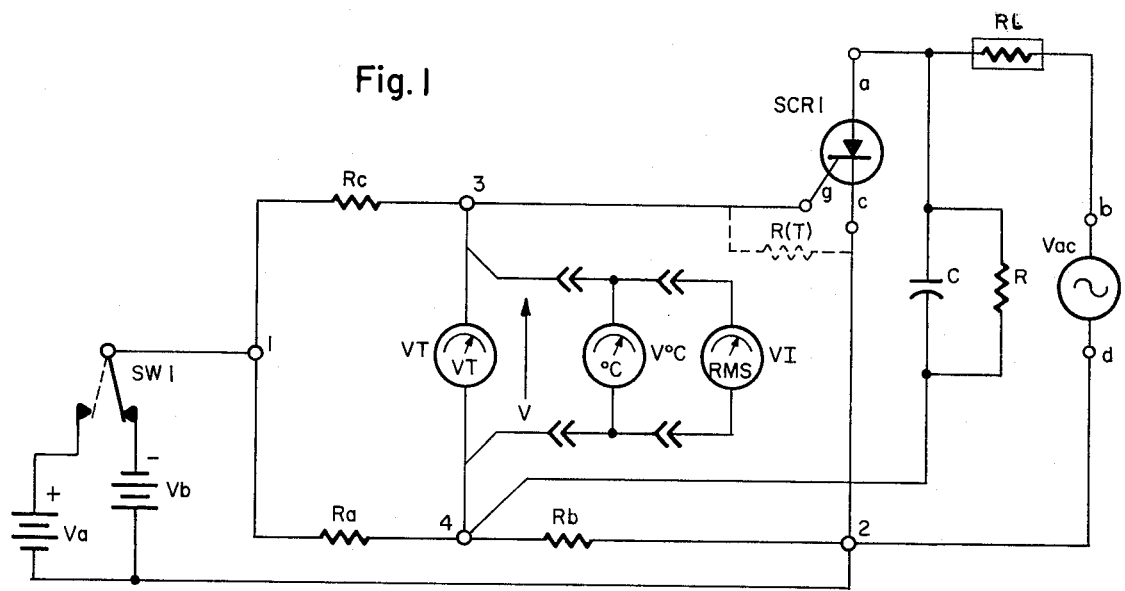
FIG. 1 illustrates schematically a first embodiment of the invention.

Reference is now made to the electrical schematic of FIG. 1 in which a load, represented by a resistor, RL is connected in series circuit with a source of AC voltage Vac and a thyristor, suitably a silicon controlled rectifier SCR1, connected in the series circuit by connections to its anode, a, and its cathode, c, typical of the circuits in which current to the electrical load is passed or blocked in dependence upon the semiconductor controlled rectifier being triggered into the current conducting condition or not. For convenience and for clarity of understanding, four circuit junction points are illustrated and labeled 1, 2, 3, and 4, which physically may be simply arbitrary locations along the indicated portion of the electrical circuit schematically represented in the figure, as is understood to those skilled in the art.

A first resistor Ra and a second electrical resistor Rb are connected electrically in series circuit between juncture 1 and junction 2, and hence to the cathode of SCR1 connected in common with juncture 2. A third electrical resistor Rc is connected between juncture 1 and juncture 3. The gate, g, of SCR1 is connected to juncture 3 which thus places the gate to cathode circuit or junction of SCR1 in series with resistor Rc between junctures 1 and 2. The gate to cathode junction is symbolically represented in phantom lines as a resistance R(T). As those skilled in the art easily recognize, a resistance bridge is formed having inputs at junctures 1 and 2, an output across junctures 3 and 4, and bridge arms consisting of Rc, R(T), Ra and Rb.

The first source of DC represented by battery Va is connected with its positive terminal to the first make contact of a switch SW1 and its negative terminal connected in circuit with juncture 2. A second DC voltage source, Vb, has its negative polarity terminal connected to the second make contact of switch SW1 and has its positive polarity terminal connected to circuit juncture 2. The swing contact of SW1 is connected to input juncture 1. A parallel connected circuit of resistor R and capacitor C, empirically chosen to compensate for anode to gate effects of the SCR as later explained, is connected in circuit between juncture 4 and anode a.

A voltage measuring instrument represented by voltmeter VT, may be connected across the bridge output between circuit junctures 3 and 4.

Silicon controlled rectifier SCR1 is a known type of semiconductor switching device which with a positive voltage applied to its control terminal, gate g, to forward bias the gate, switches from a noncurrent-conducting to a current-conducting state and passes current from anode to cathode and remains in that conductive state until the anode current reduces below a small level or completely to zero, such as when the AC current from source Vac is reversing in direction, and then restores to the nonconducting state until the reapplication of the forward bias voltage at gate g during source Vac forward voltage times.

Thus with switch SW1 swing contact in contact with the left make contact, as represented by the dash line, the positive polarity voltage of source Va is applied via juncture 1, resistor Rc, juncture 3 to gate g to forward bias the gate g relative to cathode c, thus triggering SCR1 into its conductive state. SCR1 passes current from source Vac and through load RL during each half cycle of the AC source in which the phase of the source voltage at terminal b is positive relative to terminal d, thus passing a DC current through load RL on alternate AC half cycles. The operational supply of electrical current to load RL is a principal purpose of the foregoing circuit.

Current through the SCR generates heat therewithin at the semiconductor junctions as is true for all semiconductor devices in general. Considering source Vac to be relatively low impedance and constant voltage and RL to be variable, it is apparent that as RL decreases in resistance, the current increases causing higher currents and power to be handled by the SCR and increasing heating within the SCR.

Next consider the circuit with the transfer contact of SW1 in the illustrated position. Negative polarity voltage from source Vb is applied via resistor Rc to reverse bias gate g relative to cathode c. And SCR1 switches into its nonconductive state once the AC load current reverses in direction where the voltage across the SCR anode and gate reverses and SCR1 remains in the nonconductive state.

In the conventional sense, current flows into bridge input juncture 2, dividing in the arms of the resistance bridge, part passing through resistors Ra and Rb and out input juncture 1 back to source Vb, and part passing through the cathode to gate junction and resistor Rc back to source 1. The voltage developed across the bridge output, junctures 3 and 4, depends upon the effective resistances of the arms of the bridge including Ra and Rb and Rc and the semiconductor junction's effective resistance and leakage. Preferably the component resistances used in the bridge of this and other embodiments can be of low temperature coefficients or are maintained in a controlled temperature environment.

Thyristors, such as SCR1, and semiconductors in general possess a temperature coefficient in the reverse biased condition as is well known in the art. In the circuit for $Rc/Ra = RSCR/Rb$ and both the gate and anode back or reverse biased, the voltage V appearing across the junctures 3 and 4 and read on the voltmeter VT is proportional to the net gate reverse leakage current and effective internal resistance which is proportional to temperature of the gate-cathode junction of the semiconductor. The change in voltage on voltmeter VT represents thus a change in the semiconductor's junction temperature. For each circuit and semiconductor, temperature versus bridge voltage is obtained by calibration, such as by using static testing procedures---heating the semiconductor to a known temperature and checking the voltage on VT. Indeed for a direct junction temperature indication, the measuring instrument such as a voltmeter, has its readout indicator or scale represented in degrees of temperature. °C., such as represented by temperature calibrated meter V° C. in FIG. 1.

By way of further example, the voltage measuring device may have a readout or scale calibrated in RMS current, such as is represented in FIG. 1 by meter VI. Inasmuch as the junction temperature is proportional to the effective or RMS current passing between the main current-conducting terminals of the semiconductor, anode and cathode of SCR1, the voltage between junctures 3 and 4 provides a direct integration of current. Calibration is simply accomplished by passing known currents through the semiconductor and measuring the temperature induced voltage change between the junctures 3 and 4 as is understood by those skilled in the art.

To enhance the accuracy of the derived voltages, the parallel combination of resistor R and capacitor C is connected in circuit between the circuit juncture 4 and anode a, the latter of which is a main current-conducting terminal of the semiconductor that is not in the current path of the bridge current source Vb. The values of R and C are chosen suitably empirically determined for each semiconductor used, to balance out or compensate for the control terminal, gate g, to main terminal, anode a, capacitance and reverse leakage inherent in the SCR, which minimizes the effect of that inherent semiconductor characteristic on the bridge circuit.

The novel circuit of FIG. 1 provides an operational indication of semiconductor junction temperature. The switch SW1 is turned to one position allowing regular operation of the circuit and then switched to the other position to stop regular operation and check the junction temperature during load current off times.

Figure 2:
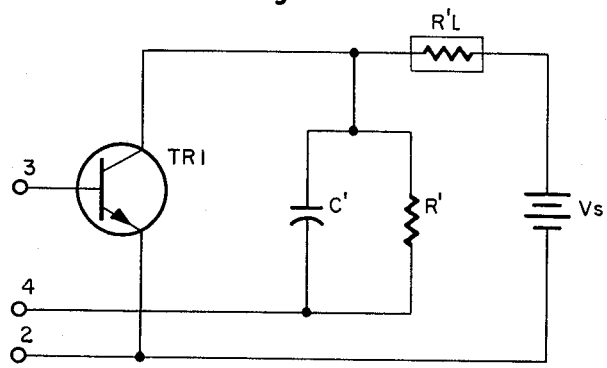
FIG. 2 is a partial schematic illustration of a modification to the embodiment of FIG. 1.

By means of the partial electrical scehmatic illustration of FIG. 2, another type of semiconductor, the transistor TR1, is adapted in the circuit. The collector to emitter is connected in series with an electrical load, RL, and a DC source Vs. Considering the circuit of FIG. 1 in connection herewith in which SCR1, RL, Vac, and R and C are deleted, the partial circuit of FIG. 2 is substituted as represented by the connection of transistor base to juncture 3, the emitter to juncture 2, and compensating R' and C' between collector and juncture 4. In a practical embodiment of the circuit it is understood that the particular specific values selected for the resistors and capacitors is different.

Figure 3:
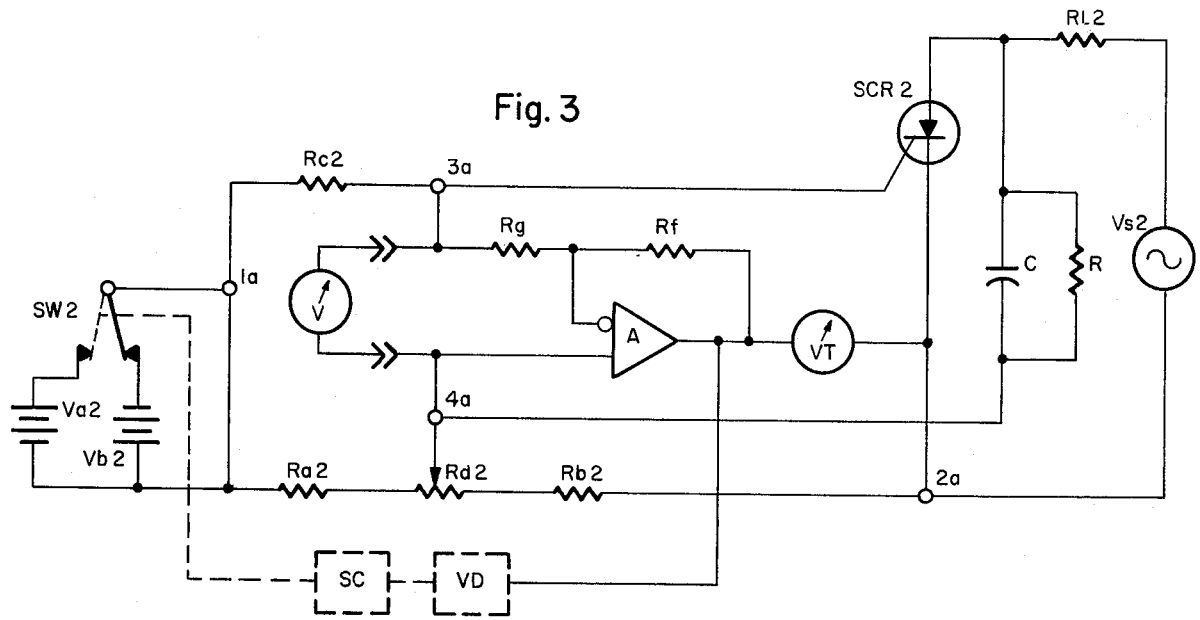
FIG. 3 is an illustration of a second embodiment of the invention partially in schematic form and partially symbolic.

The principles of the foregoing discovery are supplemented in the embodiment of FIG. 3 presented in the form of a partial schematic and partial symbolic illustration.

The anode of thyristor SCR2 is connected to an end of electrical load RL2 and the other end thereof is connected to a terminal of AC source Vs2 and the remaining terminal thereof is connected to the cathode of SCR2 via circuit juncture 2a to form a series electrical circuit. Resistor Rc2 is connected between juncture 1a and the gate of SCR2 via juncture 3a. Resistor Ra2, potentiometer resistor Rd2, and resistor Rb2 are connected in series between junctures 1a and 2a. Potentiometer resistor Rd2 contains a positionable tap at which circuit juncture 4a is selected. This tap allows adjustment of the arm resistance and bridge reference voltage.

A resistor Rg is connected between juncture 3a and the inverting input of operational amplifier A. A resistor Rf is connected between inverting input of the operational amplifier and its output. A measuring instrument VT is connected between the amplifier output and juncture 2a. Compensating network R and C, in parallel is connected between juncture 4a and the anode of SCR2. Switch SW2' makes alternate contact with the positive polarity of source Va2 and the negative polarity of source Vb2 and thus far with the inclusion of the operational amplifier is the same as that of FIG. 1. By way of a demonstrable example, SCR2 is a type CS401 Brown Boveri; source VS2 is 240V. 60 cycle; R is 470 pf; C is 50 megohms; A is National type LM1458; Rc2 is 15 ohms; Ra2, Rd2, and Rb2 are each 1,000 ohms; Rg is 1,000 ohms; and Rf is 100K ohms; source Va2 is 10 volts and source Vb2 is −6 volts. The top of the potentiometer Rd2, hence juncture 4a, is set to the center control temperature, and the value of Rf selects the indication range derived at the output of amplifier A. The output, measured at VT is directly proportional to the thyristor's gate cathode junction temperature and covers a 10 degree Celsius range. Increasing the value of Rf narrows the temperature indicating range and vice-versa.

In the circuit of FIG. 3 a switch controller SC is coupled to switch Sw2 as represented by the dashed line to the swing contact of SW2. The controller automatically and periodically transfers the switch contact from source Va2 and Vb2 to alternately forward bias and then back bias SCR2. The controller contains an inhibit input connected to the output of a voltage detector VD. Detector VD provides an output when the voltage at its input exceeds a selected level. Both of these VD and SC can be of any conventional structure known or apparent based on the outlined purposes.

In operation, should the output of amplifier A exceed a set level, representing SCR junction temperature maximum has been reached, detector VD detects that and provides an output to SC, which in turn inhibits the automatic operation, retaining switch SW2 in the down position in which SCR2 is back biased, to prevent the SCR from passing further current and increasing junction temperature. Once the input to VD falls, SC then returns to normal operation cycling switch SW2.

Ideally SC and SW2 are of the fast response type that allows SW2 to forward bias SCR2 during the positive half cycles of source VS2 as applied to the SCR anode, and to reverse bias SCR2 during the negative half cycles.

The circuit thus serves as a protection device for the semiconductor switch device in an operational circuit by means of which the junction temperature of the SCR is prevented from reaching levels that would destroy the semiconductor.

Viewed in another application and with different calibration of the circuit elements, the circuit functions as a thermostat. Inasmuch as the semiconductor's junction temperature is a function of current between the anode and gate which in turn is proportional to electrical heating of load RL2, the tap may be set so that at a predetermined temperature of load RL2 by thermal coupling to SCR2, the circuits VS and SC function to stop curent in the aforedescribed manner.

Figure 4:
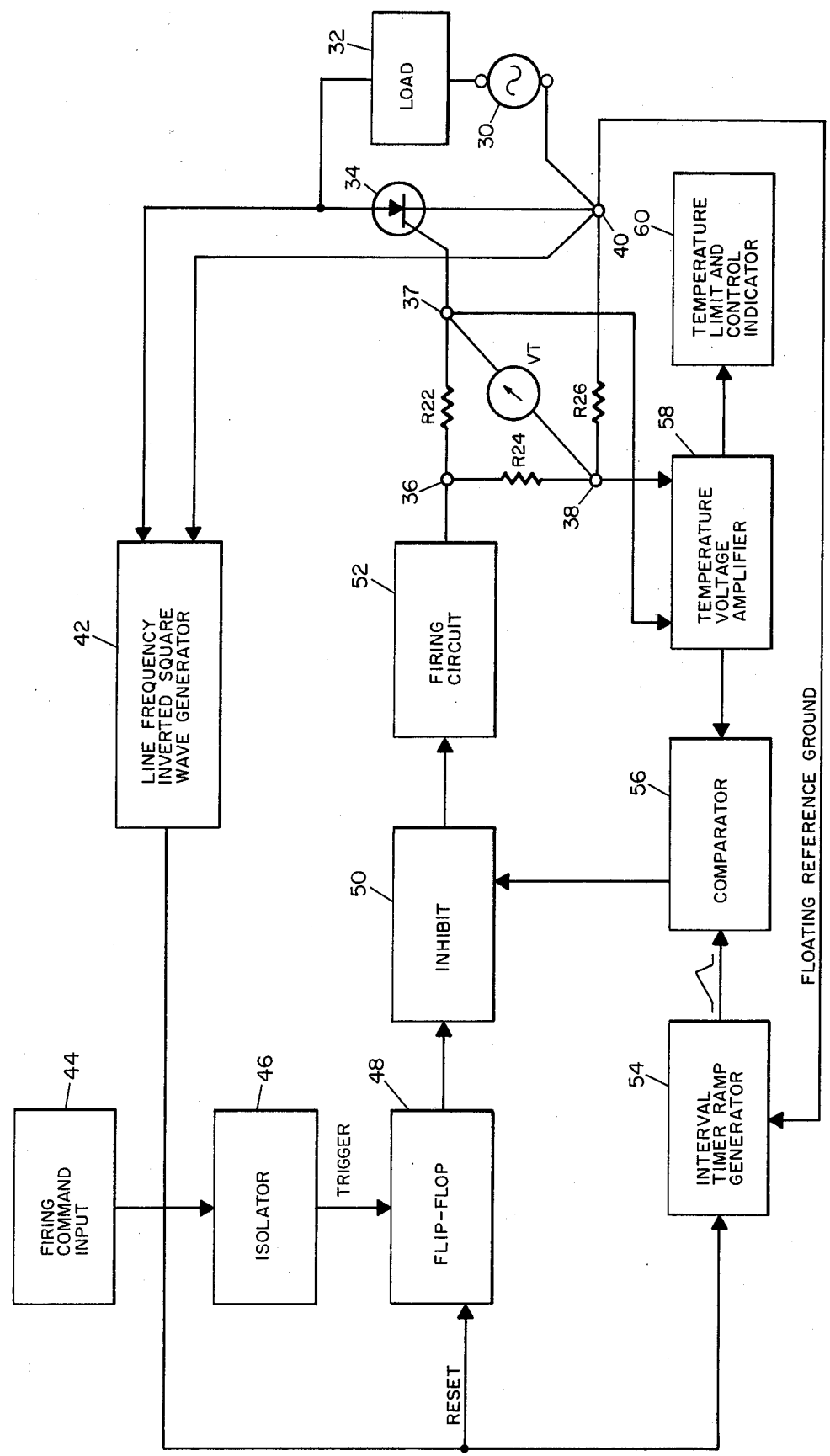
FIG. 4 is an illustration of an invention in a novel phase control circuit and resistance welder control circuit presented in a block diagram.
Figure 6A:
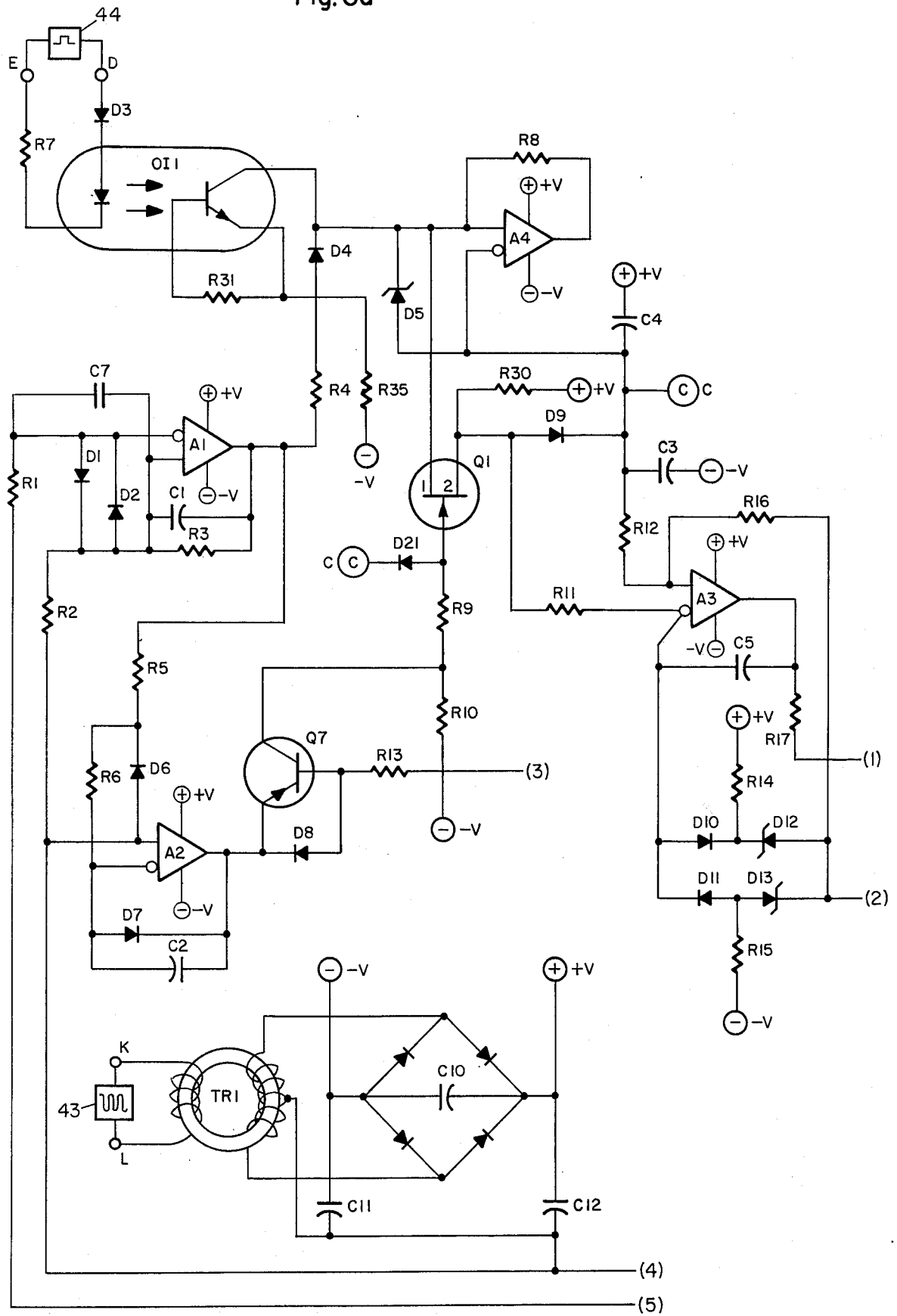
FIGS. 6a and 6b illustrate the embodiment of FIG. 4 in electrical schematic diagram form.
Figure 6B:
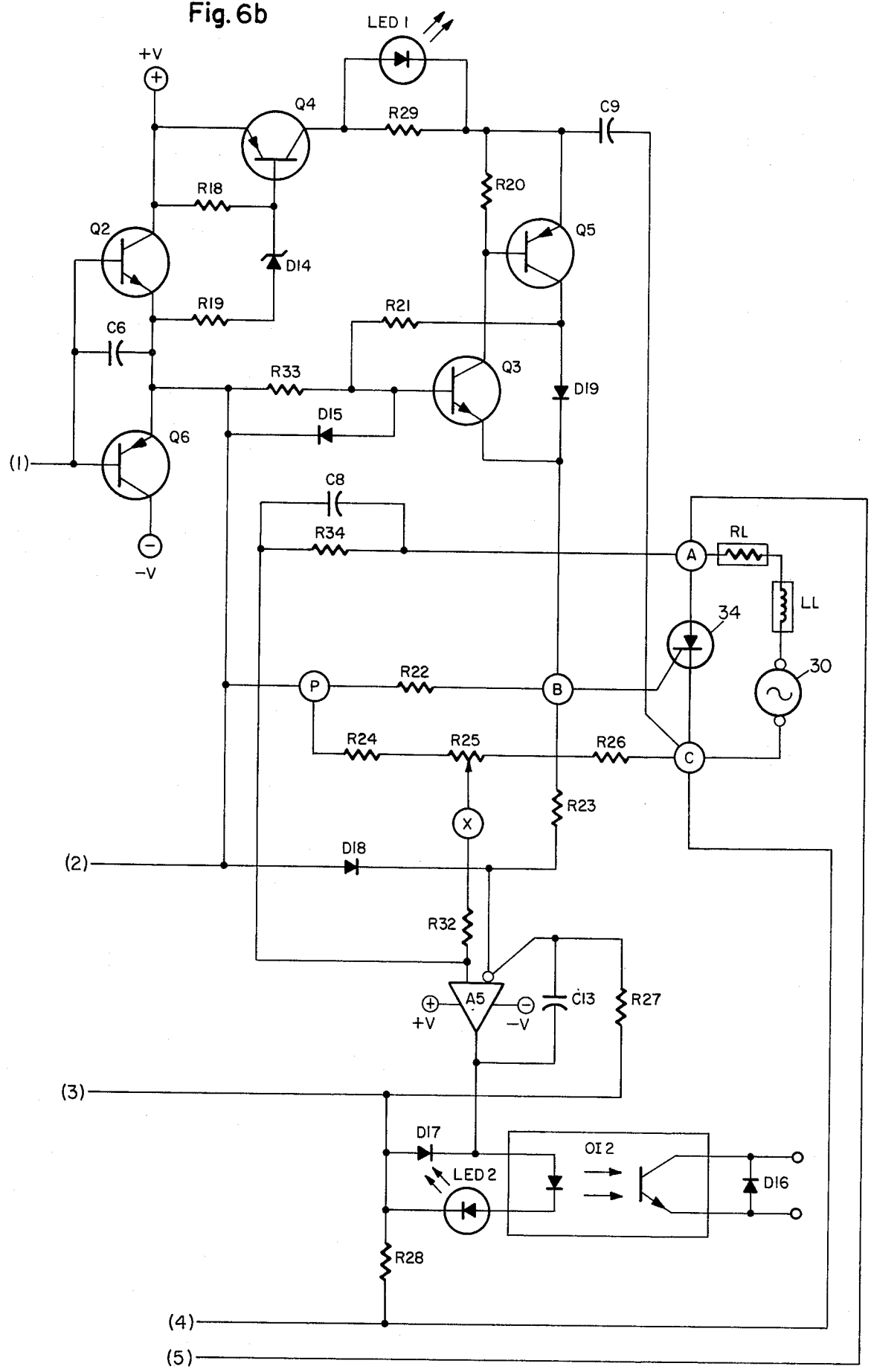

The foregoing principles are enlarged upon in providing intracycle capability in a preferred application presented in the novel welding control circuit outlined in block diagram from in FIG. 4 and schematically in FIGS. 6a, 6b next considered.

The embodiment of the invention illustrated in block diagram in FIG. 4 shows power source 30, typically 480 volts 60 hertz, connected in series circuit with resistive and reactive load 32 and thyristor 34, the latter of which is connected in the circuit by connections to the anode and cathode, the two main current-conducting terminals of the semiconductor device. The resistive bridge network includes resistor R22 connected between circuit junctions 36 and 37; the gate of thyristor 34 connected to circuit juncture 37 and the cathode thereof to circuit juncture 40; The resistor R24 connected between circuit juncture 36 and 38, and resistor R26 connected between circuit juncture 38 and 40. The resistance bridge input is formed essentially across circuit junctures 36 and 40 and the output of the bridge is, as represented by the voltmeter VT, taken across the circuit junctures 37 and 38.

The voltage from source 30 is applied to the input of a line frequency inverted squarewave generator 42. A firing command input circuit 44 is coupled to the input of an isolator 46 and in turn the output of the isolator is connected to a trigger input of a flip-flop 48. The output of flip-flop 48 is connected to the input of an inhibit switch circuit 50 and in turn the output of the inhibit switch 50 is connected to the input of firing circuit 52.

As is shown in the diagram, the output of firing circuit 52 is connected to the input of the resistance bridge network 36 and normally provides a negative polarity voltage at juncture 36. The output of squarewave generator 42 is connected to an input of flip-flop 48 and to an input of an interval timer ramp generator 54. The output of ramp generator 54 is connected to one input of voltage comparator 56. The output of the resistance bridge taken across circuit junctures 37 and 38 is applied to the input of a voltage amplifier 58 and, in turn, the output of the voltage amplifier is connected to the second input of comparator 56. The output of voltage comparator 56 is as shown connected to a second control input of inhibit switch 50.

Additionally, another output from voltage amplifier 58 is connected to the input of temperature limit and control indicators 60.

Power source 30 provides the cyclically varying AC voltage to generate 42. Line frequency inverted squarewave generator 42 clips, inverts, and squares the voltage sensed across thyristor 34 and provides an output voltage that is squarewave in shape and 180 degrees out-of-phase with the line voltage. The negative portion of the squarewave is used to enable thyristor firing whereas the positive portion which occurs during thyristor reverse anode-to-cathode bias disables existing and future firing inputs, as may become more apparent in the discussion of FIGS. 5a–5b. Thus during the negative square-wave portion, flip-flop 48 is enabled and is in its first bistable condition. During the time that the flip-flop 48 is enabled a firing command input signal applied through isolator 46 triggers flip-flop 48 into its second bistable state where the circuit is to fire firing circuit 52. When the thyrsitor gate-to-cathode junction temperature is not in the control range, the firing inhibit switch 50 conducts the firing command represented by the flip-flop 48 being in the second bistable state into firing circuit 52.

Firing circuit 52, normally providing a negative polarity voltage, applies a very fast rising positive polarity voltage pulse, typically having a rise time of under one-quarter microsecond, to the gate of thyristor 34 via resistor R22 of the bridge network. This resulst in a near instantaneous high thyristor gate current provided by circuit 52 which decays to a lower gate holding current, typicaly between 100 and 600 milliamperes over a period of 100 to 1,000 microseconds. The fast rising gate current triggers the thyristor to switch into its conductive state and conducts current from its anode to cathode in the series circuit until the current in the series load circuit reverses direction.

On the positive portion of the squarewave which next occurs, the flip-flop is reset to its first stable state. At the reset time of flip-flop 48, which corresponds to thyristor current reversal, which may lag power source 30 voltage reversal because of the reactive nature of the load, firing circuit 52 returns to its negative voltage state and provides a reverse bias at juncture 36 which is coupled by resistor R22 to the thyristor gate. During the time that this reverse bias is applied to the thyristor gate until the next firing command signal from command input 44, the gate-to-cathode junction is operated in the junction thermal coefficient sensing bridge. The bridge output voltage taken across circuit junctures 37 and 38 is amplified by voltage amplifier 58. The resulting voltage of amplifier 58 is applied to one input of comparator 56.

Referring back to generator 42, the output of generator 42 is applied to the input of interval timer ramp generator 54. At the commencement of the negative portion of the squarewave output from generator 42 and over the interval thereof, generator 54 provides an output that rises linearly in level and which abruptly resets when the output of generator 42 goes positive, hence the term "ramp". The output of ramp generator 54 is applied to the second input of the comparator and the comparator compares the ramp shaped voltage, which rises during the thyrsitor forward biased interval, with the temperature representative voltage output of amplifier 58. Whenever the temperature voltage exceeds the level of the ramp voltage, which is normally the case at the beginning of the temperature controlled timing interval, the output of the comparator operates inhibit switch 50 to prevent a firing signal from reaching the firing curcuit 52 irrespective of the state of flip-flop 48, hence the flip-flop 48 cannot trigger the firing circuit. If at some time during this interval the ramp voltage exceeds the temperature voltage, the inhibit circuit is restored and no longer inhibits the transmission of the flip-flop output and the flip-flop output is applied to the input of firing circuit 52 which thereupon provides the forward bias pulse to thyristor 34.

As a result, the thyristor is at that time during the AC half cycle switched into the current-conducting condition. As is apparent, the power passed by the thyristor is proportional to the duty cycle, that is to the portion of the AC half cycle during which the thyristor is actually conducting current.

FIGS. 5a–5h illustrates the various waveshapes of the voltage and currents involved in the foregoing operation. Thus, FIG. 5a represents the sinusoidal line voltage applied across thyristor 34 by the source. FIG. 5b illustrates the squarewave output of the squarewave generator 42 in relation to the line voltage. The squarewave voltage is seen to be 180° out of phase with the voltage of FIG. 5a. FIG. 5c illustrates the firing command pulses which are applied through isolator 46 to the trigger input of flip-flop 48. This is typically a 20 ma. current pulse of at least 20 microseconds duration. FIG. 5d illustrates the flip-flop output. Note that the first output condition is a voltage high and when triggered into its second state by a command pulse, the output is a voltage low, and that the output remains in that state until the squarewave FIG. 5b reverses from the negative to positive polarity. And during the next half cycle the flip-flop is and remains reset to its first condition. The flip-flop thus stores the fact that a command pulse is received during the positive half cycle of AC. FIG. 5e represents the output of amplifier 58 representative of the temperature of the thyristor gate-to-cathode junction. As is apparent, as long as the input to amplifier 58 is below the excess level the output is high, when the temperature lowers, the output goes low, and during thyristor trigger times amplifier 58 is driven low as shown.

FIG. 5f illustrates the linearly rising ramp-like voltage output of ramp generator 54 during the negative portion of square wave output (FIG. 5b). The FIG. 5g illustrates the firing voltage output of firing circuit 52 which, during operation, is applied to the gate of the thyristor. A waveshape of the firing pulse for a longer thyristor conduction time is represented in FIG. 5h.

In effect, an intercycle phase control is provided in FIG. 4. It is also clear from the FIGS. 5a–5h that if the temperature voltage FIG. 5e does not fall to a level below that of the ramp generator depicted in FIG. 5f during the AC half cycle, the thyristor 34 is not fired at all during that half cycle. This occurs when the semiconductor needs a greater period to cool.

It is clear from the foregoing description that the firing circuit 52, the command input signals periodically presented from command input 44 serve as a bias voltage control means to in its first condition apply a negative bias to circuit juncture 36, the resistance bridge input, to reverse bias the thyristor gate and, alternately, in its second condition to apply a positive voltage bias at that juncture to forward bias the thyristor gate. And it is seen that the inhibit circuit 50 serves as a means which effectively inhibits the foregoing circuit from going into its second condition or, as variously viewed, retains such bias control means in its first conditon whenever the temperature representative voltage amplifier 58 presents a FIG. 5f illustrates the linearly rising ramp-like voltage output of ramp generator 54 during the negative portion of square wave outpt (FIG. 5b). The FIG. 5g illustrates the firing voltage outputof firing circuit 52 which, during operation, is applied to the gate of the thyristor. A waveshape of the firing pulse for a longer thyristor conduction time is represented in FIG. 5h. voltage that is detected and determined to be higher than a present maximum by the action of ramp generator 54 and voltage comparator 56.

Reference is now made to the electrical schematic of FIGS. 6a, 6b in order to consider this embodiment in somewhat greater detail than that presented in the block diagram of FIG. 4 and to permit certain additional features to be presented.

Initially it is noted that the low voltage used for operation of the transistors and integrated circuit amplifiers in the specific embodiment of FIGS. 6a, 6b is provided by a high frequency AC source, 43, illustrated, applied across terminals K and L. The AC voltage provided is transformed by ferrite core type transformer TR1, and the voltage is taken across the ends of a center tapped secondary winding and applied across the input arms of a conventional four diode rectifier bridge and with the center tap connected to juncture C which serves as a floating ground or reference. Thus the voltage at one output end of the bridge rectifier is positive or +15 volts relative to the center tap or ground and the other end is negative −15 volts relative to ground. Capacitor C10 connected across the bridge outupt ends, capacitor C11, connected between one output end and ground, and capacitor C12 connected between the other bridge output end and ground serve the conventinal function as filter capacitors. In order to avoid unnecessary lines in the figure, connections that are made to the positive end of the power supply are designated simply ⊕ +V while a connection to the negative end of the source is designated ⊖ −V.

The electrical load, represented by the series connected resistor RL and inductor LL, is connected between circuit juncture A and one terminal of source 30 and the remaining source terminal is connected to juncture C. Thyristor 34 has its anode connected to juncture A and its cathode connected to juncture C to place the source, load, and thyristor in a series current-carrying circuit. The resistance network includes resistors R22 connected between circuit junctures P and B; thyristor gate connected to circuit juncture B; resistor R24, a potentiometer resistor R25, and a resistor R26, preferably low temperature coefficient resistors, are connected in electrical series circuit between circuit juncture P and juncture C.

The output of the resistor bridge network described is taken across circuit junctures B and X. Juncture B is connected in series with resistor R23 to the inverting input of an operational amplifier A5. Juncture X, which is taken on the tap of potentiometer resistor R25, is connected to the reference input of that amplifier in series with a resistor R32. R32 serves to raise the nodal input impedance of A5's reference input in order to permit the addition of high impedance components to compensate for thyristor internal anode to gate capacitance and leakage resistance: i.e., capacitor C8 and resistor R34 are connected in parallel between juncture A and A5's reference input. A capacitor C13 is connected between the inverting input of A5 and its output and limits the amplifier's bandwidth. Amplifier A5's feedback resistor R27 is connected between the inverting input and the anode end of a diode D17 and the diode, in turn, has its cathode end connected to the output of A5.

Further, the anode end of diode D17 is connected to one end of resistor R28 and the other end of R28 is connected to the circuit ground, juncture C.

The anode end of diode D17 serves as the output of the voltage amplifier circuit. That location is connected by the lead illustrated to an end of resistor R13 associated with the voltage comparator circuit of transistor Q7, as will be hereinafter discussed.

Additionally, the output of amplifier A5 is connected to an input of an optical isolator OI2 in series with a light emitting diode indicator LED2 to the ungrounded end of resistor R28. A remote indication may be taken from the output of OI2 and applied to other indicators and controls. Diode D16 protects the output of OI2 against reverse voltages.

The squarewave generator is next considered. Resistor R1, parallel connected capacitor C7 and oppositely poled diodes D1 and D2, and resistor R2, are connected in series circuit between junctures A and C. One end of the diodes is connected in circuit to the inverting input of amplifier A1, and the diode ends connected to resistor R2 are connected to the reference input of operational amplifier A1. A capacitor C1 and resistor R3 are connected in parallel between the amplifier's output and the reference input thereof. A positive voltage input of the amplifier and a negative voltage input are connected to the power source as designated. This forms the inverting squarewave generator which takes the sinusoidal voltage across the thyristor, clips, squares and inverts same to provide a low voltage squarewave voltage of line frequency that is 180° out of phase with the input AC. The output is connected to the inputs of operational amplifiers A2, and in series with resistor R4 and diode D4 to the reference input of operational amplifier A4, the diode poled with its cathode to said input of A4.

A source of command input pulses, 44, is coupled to circuit junctures E and D and these junctures are connected in series with a series circuit consisting of resistor R7, the input terminals of optical isolator OI1 and diode D3 poled with its anode toward terminal D. The base emitter output terminals of OI1 have connected thereacross resistor R31. The emitter of OI1 is connected to the −15 volt power supply through series connected resistor R35. The collector output of OI1 is directly connected to the non-inverting input of amplifier A4. OI1 is an optically coupled light emitting diode and phototransistor combination, having high voltage insulation capability, which conducts output current when the input current is sufficient in level to light the light emitting diode.

The circuit of the memory flip-flop is next described. Zener diode D5 is connected between the reference input and the inverting input of A4 an operational amplifier with the cathode of D5 connected to the non-inverting input and the anode grounded. A resistor R8 is connected between the output of A4 and its non-inverting input, and the latter to the source terminal of a junction field effect transistor Q1.

The output at collector of OI1 is connected to the reference input of operational amplifier A4 together with the output of amplifier A1 connected through R4 and D4. The circuit of A4 is thus configured as a flip-flop, a bistable switch having two stable states. The output from A1 if positive resets this flip-flop, and so doing places it in its second stable state. When the output of A1 is negative, then a firing pulse from OI1 toggles this flip-flop placing it in its first stable state.

Consider the operation of this portion of the circuit. Whenever the inverted squarewave at the line voltage frequency, hence A1's output, is positive, A4 is driven into its second stable state or positive output state, as variously termed. This, as becomes apparent, prevents the thyristor from being fired whenever it has a reverse anode to cathode voltage across it.

Alternatively, when A1's output goes negative, at the same time that the thyristor's anode voltage goes positive, A4 remains in its positive output state until current is drawn by OI1's output phototransistor. A command pulse from source 44 at the input of OI1 results in the output transistor thereof conducting to pull the reference input of operational amplifier A4 to its negative stable state. The forward current diode drops of about $-\frac{3}{4}$ volts and zener voltage of about 5.6 volts by zener diode D5 limits input voltage to A4. R8 provides hysteresis current to hold A4 in its two stable states (outputs of +12 volts and −12 volts as example) after being driven into those states by D4 and OI1.

A4's input which responds faster than can A4 is passed forward through Q1 of the firing circuit.

A junction field effect type transistor Q1, abbreviated JFET, serves as the inhibit switch and contains source 1, drain 2, and gate terminals. The output of amplifier A4 is connected to source terminal 1 of JFET Q1 and the inverting input of A4 is connected to reference ground, as designated simply by the symbol Ⓒ to avoid extending a lengthy line to the other location. Capacitor C4 is connected between juncture C and +V and a like capacitor C3 is connected between C and −V to ensure that +V and −V are bypassed for high frequencies at amplifier A3 power inputs. A series circuit of resistors R9 and R10 are connected between the JFET gate and −V power supply and a resistor R30 is connected between the drain 2 of Q1 and power supply +V. The anode of diode D9 is connected to drain 2 of Q1 and its cathode end is connected to circuit ground at juncture C. And the anode of diode D21 is connected to the JFET's gate and the cathode end to the circuit floating ground as designated by the symbol Ⓠ. The juncture between R9 and R10 serves as the input to this switching circuit. Thus, when Q7 conducts effectively shunting R10 more positive than ground Ⓠ, Q1 is switched to its on or conducting condition. Q1 otherwise remains nonconducting.

Resistors R5 and R6 are connected in series between the output of operational amplifier A1 and the inverting input of operational amplifier A2. A diode D6 is connected between the reference of non-inverting input of A2 and the juncture of resistors R5 and R6 with the cathode of the diode connected to that juncture. The reference input of A2 is further connected to the circuit juncture C, circuit ground. Diode D7 has its cathode connected to the output of A2 and its anode end is connected to the inverting input of A2. Diode D7 is shunted by a ramp integrating capacitor C2. The circuit forms the interval timer ramp function generator providing a ramp voltage output during the input of a negative portion of the squarewave voltage supplied at the output of A1.

In this circuit portion, A2 is a ramp voltage generator whose output charges C2 to the forward voltage drop of D7 below ground voltage level when squarewave generator A1 output is positive corresponding to a time when the thyristor anode is a negative voltage. When source 30 voltage goes positive at the thyristor anode, the output of A1 goes negative and A2 charges C2 at a constant rate where the feedback current from C2 exactly matches the input current through R6. Since the voltage across R6 is held at a slightly negative voltage, about $-\frac{3}{4}$ volt, due to D6's forward voltage drop, when the output of A1, the squaring circuit, biases D6 forward, and the negative input of A2 is held at ground by current through C2, the current through R6 is essentially constant and C2 charges at a constant positive rate commencing from a slight negative voltage (the forward bias voltage of D6) at such time as the voltage applied by the source to the thyristor anode goes positive.

The output of A2 is coupled to the emitter of a PNP type transistor Q7. The collector of Q7 is connected in circuit to the juncture of resistors R9 and R10, previously described. A reverse bias protection diode D8 has its anode end connected to the base of Q7 and its cathode end connected to the emitter thereof. A resistor R13 is connected in series with the base of Q7 and the output of the voltage amplifier A5. The circuit serves as a simple form of voltage comparator.

If the positive going ramp voltage output of A2 ever forward biases transistor Q7, Q7 conducts causing Q1, hereinafter described, to turn on enabling the firing command to pass through to the firing circuit.

The output at the drain "2" of Q1 is coupled through series resistor R11 to the inverting input of operational amplifier A3 at the firing circuit. A resistor R12 is connected between circuit ground Ⓒ and the reference input of A3 and a resistor R16 is connected between the reference input of A3 and the emitters of complementary emmiter follower output transistors Q2 and Q6. Capacitor C5 is connected between the inverting input and the output of A3. The output of A3 is further connected in series with resistor R17 to the base of each of transistors Q2 and Q6.

A diode D10 and a zener diode D12 are oppositely poled and connected in series circuit between the inverting input of A3 and the emitters of transistors Q2 and Q6 with the anode end of D10 at the inverting input. A second pair of diodes D11 and zener diode D13 oppositely poled are connected, oppositely poled to the aforementioned diodes between those same two locations with the cathode end of D11 at the inverting input. The juncture between diodes D10 and D12 at the cathode end of D10 is connected in series with resistor R14 to source $+V$ and the juncture between diodes D11 and D13 at the anode end of D11 is connected in series with resistor R15 to source $-V$.

In the circuit shown, the bases of current amplifier transistors Q2, an NPN type, and Q6, a PNP type, are connected in common. Likewise the emitters of Q2 and Q6 are connected in common circuit. And capacitor C6 is coupled between the bases and emitters. The collector of Q6 is connected to source $-V$ and the collector of Q2 is connected to source $+V$. This forms a complementary emitter follower circuit.

Transistor Q4, a PNP type, has its emitter connected to source $+V$ and a bias resistor R18 connected between the Q4 emitter and base. A resistor R19 and zener diode D14 are connected in series between the emitter of Q2 and the base of Q4; with the diode poled with its cathode end at the Q4 base. A resistor R29 and a light emitting diode LED1 are connected in parallel between the collector of Q4 and one end of a capacitor C9, with the remaining end of capacitor C9 connected to reference grounds, circuit juncture C.

A transistor Q3, an NPN type, has its collector connected to the base of transistor Q5, a PNP type. The emitter of Q5 is connected to the one ungrounded end of capacitor C9 and a resistor R20 is connected between the same capacitor end and the Q5 base. A diode D19 is connected with its anode end to the collector of Q5 and its cathode end connected to the emitter of Q3 and to circuit juncture B. A diode D15 is connected in parallel with a resistor R33 between the emitters of Q2 and Q6 with the diode poled so that its anode end is connected to Q3 base, and a resistor R21 is connected between the base of Q3 and the collector of Q5. This is a conventional regenerative current switching circuit that rapidly dumps the positive charge on capacitor C9 into the thyristor gate at juncture B whenever a trigger voltage arrives at juncture P. This circuit provides both extremely fast current rise time and initial high current to the thyristors gate.

The anode end of a diode D18 is connected to the emitters of Q2 and Q6. The diode has its cathode end connected to the inverting input of amplifier A5. Diode D18 drives the output of amplifier A5 to $-V$ during thyristor trigger times. A capacitor C8 is connected in parallel with a resistor R34 between circuit juncture A and the non-inverting input of amplifier A5 to form the aforedescribed thyristor gate to anode capacitance compensating network for the thyristor.

Source voltage connections to the operational amplifiers are generally represented as $+V$ and $-V$ to the amplifier symbol. Usually a single integrated circuit chip, commercially available, contains two or more operational amplifiers. Thus, A1 and A2 may be in a single package. Hence in practice extra source voltage connections are illustrated.

Whenever the inhibit switch Q1 is open, R30 provides input bias to hold A3 in its negative state. Feedback occurs in this state through zener diode D12 and diode D10. D10 has low charge storage and capacitance to minimize A3's time to switch into its positive output state.

Resistors R14 and R15 keep zener diodes D12 and D13, respectively, biased at their zener potentials so their junction capacitances do not feedback and slow A3 as it changes between output states.

When the switch SW1 is on and when OI1 turns on or, in the alternative, when A4 is on (low state) and SW1 turns on, negative voltage is applied at A3's input. A3 thereupon switches to its positive output or thyristor firing state. In its positive output state, feedback through D13 and D11 limits the A3 output voltage to D13's zener potential. D13 is selected to give the recommended firing current through R22 into the thyristor's gate.

Diode D9 limits the voltage R30 applies to R11. R12 and R16 set A3's switching threshold hysteresis characteristic, a certain positive voltage at the inverting input is required to switch A3 to its negative output state and a certain negative voltage at the input is required to switch A3 positive, when it is in its negative output state. C5 provides negative feedback that gives a high frequency roll-off characteristic in A3's gain and prevents A3 from oscillating.

Q2 and Q6 are complementary emitter followers that supply greater output current than A3 alone. C6 reduced crossover distortion in Q2 and Q6 and improves their high frequency stability. R17 limits the load on A3.

R22 supplies on bias current to the thyristor gate during firing time and off or reverse bias thereto at other times.

With A3 in its negative output voltage state, current is drawn through D14 and R19, which causes Q4 to conduct current from source +V into capacitor C9 to charge C9 to +V. During C9's charging time, LED1 conducts some of the charging current and the light output of the LED1 provides visual indication that C9 is recharging, i.e., that the SCR has been previously fired.

When the output of A3 goes positive and the output of Q2 and Q6 goes more positive than the thyristor gate, current flows into Q3's base through R33. Q3 then starts to conduct causing Q5 to conduct which in turn aids Q3's turning to its fully conducting or on state. The structure thus forms a very fast regenerative switch which abruptly discharges C9's charge through the thyristor's gate. The regenerative nature of this firing impulse circuit provides the submicrosecond gate current rise time required for safe high current thyristor firing.

Components Q3, Q5, D19, C9, R21, R20, R33, D15, Q4, D14, R18, R19 and R29 collectively charge C9 during the thyristor's reverse blocking time and dump C9's charge into the thyristor's gate when it is triggered by A3. This latter circuit's effect is to create a very fast rising (under one-half microsecond) extra high current (up to 4 amp) initial firing pulse that decays to the gate holding on current of IG in between 100 and 1,000 microseconds; where IG = VD13Z-VGK/R22; VGK = thyristor's forward gate cathode V; and VD13Z = D13 zener voltage.

A fast rising initially higher gate current is desirable for inducing rapid thyristor turn-on to minimize current concentration hot spots in the thyristor semiconductor material.

Resistor R20 holds Q5 off, when not firing, and D15 switches the aforedescribed regenerative switch into the off state whenever reverse bias is applied to the thyristor gate.

In addition to providing a bias voltage for operation of the temperature sensing bridge, point ⓟ is held negative during both reverse and forward thyristor blocking to minimize reverse anode to cathode leakage in the first case and to improve the thyristor's critical forward voltage rise rate limit (dv/dt) in the latter case. This circuit simplifies but does not always eliminate the customary need for an external resistor capacitor network in parallel with the thyristor's anode and cathode terminals to limit the applied dv/dt. For "shorted emitter" thyristors which have low (10 to 100 ohms) internal gate to cathode parallel resistance, R22 can be chosen to drop about half the reverse gate drive voltage so the thyristor's limit on that parameter (typically 3 to 6 volts) is not exceeded. Then, D13's zener voltage can be selected to give the recommended gate holding current (IG is typically between 100 ma. and 600 ma.) by the relation VD13Z = VGK + IG R22.

A practical embodiment of the preferred embodiment of the welding control circuit includes the following parts:

| | |
|---|---|
| R1 | 270,000 ohms, 2 watt, 2,500 volt insulation |
| R2 | 1K ohms, ¼ watt |
| R3 | 47K |
| R4 | 1000 |
| R5 | 10K |
| R6 | 6.8K |
| R7 | 240 |
| R8 | 10K |
| R9 | 100K |
| R10 | 10K |
| R11 | 1K |
| R12 | 330 |
| R13 | 10K |
| R14 | 10K |
| R15 | 10K |
| R16 | 10K |
| R17 | 100 |
| R18 | 1K |
| R19 | 4.7K |
| R20 | 1K |
| R21 | 100 |
| R22 | 15 |
| R23 | 1K |
| R24 | 1K |
| R25 | 1K pot. |
| R26 | 1K |
| R27 | 100K |
| R28 | 1K |
| R29 | 10 |
| R30 | 22K |
| R31 | 100K |
| R32 | 47K |
| R33 | 2.2K |
| R34 | 100M, 2,500 volt insulation |
| R35 | 4,700, ¼ watt |
| C1 | .001 microfarads unless noted otherwise |
| C2 | 0.1 |
| C3 | 2.2 |
| C4 | 2.2 |
| C5 | 3.3 picofarads |
| C6 | .001 |
| C7 | 0.01 |
| C8 | .001 (select to cancel anode to gate capac.) 2,500 volt insulation |
| C9 | 100 |
| C10 | 0.1 |
| C11 | 100 |
| C12 | 100 |
| C13 | .001 |
| | TYPE |
| D1 | FDH 627 30 V. Signal Diode |
| D2 | " |
| D3 | " |
| D4 | " |
| D5 | Zener 5.6 V. |
| D6 | FDH 627 30 V. Signal |
| D7 | " |
| D8 | " |
| D9 | " |
| D10 | " |
| D11 | " |
| D12 | Zener 5.6 V. |
| D13 | Zener 10 V. |
| D14 | Zener 5.6 V. |
| D15 | FDH 627 30 V. Signal |
| D16 | " |
| D17 | " |
| D18 | " |
| D19 | IN4818 |
| D20 | FDH 627 30 V. Signal |
| D21 | " |
| Q1 | PN 4393 National |
| Q2 | MJE 180, Motorola |
| Q3 | MJE 180, Motorola |
| Q4 | MJE 170, Motorola |
| Q5 | MJE 170, Motorola |
| Q6 | MJE 170, Motorola |
| A1 | National LM 1458 |
| A2 | National LM 1458 |
| A3 | National LM 318H |
| A4 | National LM 1458 |
| A5 | National LM 1458 |
| THY 34 | Brown Boveri CS 501 |
| LED1 | Dialco 521-9206 |
| LED2 | Dialco 521-9214 |
| OI | Litronics IL.5 |
| OI2 | Litronics IL.5 |

In operation, A1's output is a squarewave 180° out-of-phase with the input line voltage's frequency applied by source 30 across thyristor 34. OI1 is an optical isolator whose floating inputs are terminals ⓔ and ⓓ. When OI1 receives a trigger input during the positive source 30 voltage AC half cycle, the output OI1 latches A4 negative and, during the time required to latch A4, if Q1 is gated on, it also drives A3 positive. A3 drives Q2 and Q6 and is bistable at D12's and D13's zener potentials 5.6 V. and 10 V. respectively. Q2's and Q6's output point Ⓟ drives the thyristor input resistor R22 and bridge reference leg R24, R25 and R26.

A5 amplifies the bridge temperature indication output. The gain of A5 is R27 ÷ R23 or 100 in the example given. A5's gain determines the proportional control temperature range. Whenever the output of A5 is positive and sufficient current flows, OI2 provides a floating remote overtemperature output signal and LED2 provides visual overtemperature indication. Diode D16 protects OI2 against external reverse bias and D17 protects similarly LED2 and the input of OI2. The output of A5 is fed back and compared with A2's ramp output voltage by comparator Q7. When A5's output is more positive than A2's output, Q7 turns off Q1 thereby preventing A3 from being driven positive by OI1 and A4. On its way positive, if the output of A2 becomes more positive than A5, Q7 allows Q1 to conduct current and if A4 is negative, A3 then switches to its positive level thereby causing firing of thyristor 34 by the operation of Q3, Q4, Q5 in the previously described circuit. The result of A5's temperature indication feedback is to delay firing of the thyristor for a fraction of the positive AC half cycle that is proportional to its gate cathode junction temperature. This control technique causes the thyristor to, on the average, conduct only the current each AC cycle of source 30 necessary to stabilize, hence regulate or limit, its junction temperature.

By removing R27 so A5 operates to its open loop gain, the thyristor junction temperature can increase until it exceeds a threshold selected by R25 at which time further thyristor triggering is inhibited until its junction temperature returns below that threshold.

LED1 indicates when the thyristor has been fired.

A feature apparent in the circuit of FIGS. 6a, 6b diode D18 which disables the overtemperature cutoff circuit during thyristor firing and forward conduction by forcing A5 to produce the negative supply limited voltage when the thyristor gate is forward biased.

The invention of FIGS. 4 and 6a, 6b offers a thermal protection method for thyristors and switching semiconductors which gives operating control over junction temperatures instead of case temperatures. The resulting improvements in thermal response time and accurate reaction to junction peak temperature instead of necessarily averaged case temperatures allows shutdown limiting fast enough to prevent fault induced overtemperature failures. This means that expensive thyristors (often hundreds of dollars each) can be inexpensively protected against all but instantaneous (first cycle) overheating. This thermal protection circuit's worst case reaction time of one-half an input cycle period (8⅓ milliseconds at 60hz.) is faster than the fastest high current fuses often used in thyristor fault protection so this invention can be used to replace those fuses. The savings of eliminating other fault protection means more than pays for the extra cost and complexity in the firing circuit.

The invention is expected to find wide application in high power control systems, high power conversion and transmission systems, and uninterruptible power systems to name a few, where high power semiconductors are now in use. Although presented as a high power resistance welding contactor protection device to improve the reliability of thyristors in that application, where fault currents are common, this operational method of sensing and controlling semiconductor temperature may also be used as a simple, economical thermostat in the temperature operating range of the sensing semiconductor, i.e., up to 125° C. for most thyristors. In that application the load RL in FIG. 6b is a heating element or its control input and the load is thermally coupled to the thyristor such as by means mounting the thyristor package in proximity to the load or by thermally conducting material, metal, heat pipes, etc. to the load. Thus heat from the load heats the thyristor as well. By setting the tap on R25, suitably calibrated, the thyristor junction temperature is controlled or limited and hence the load temperature as well.

Figure 7:
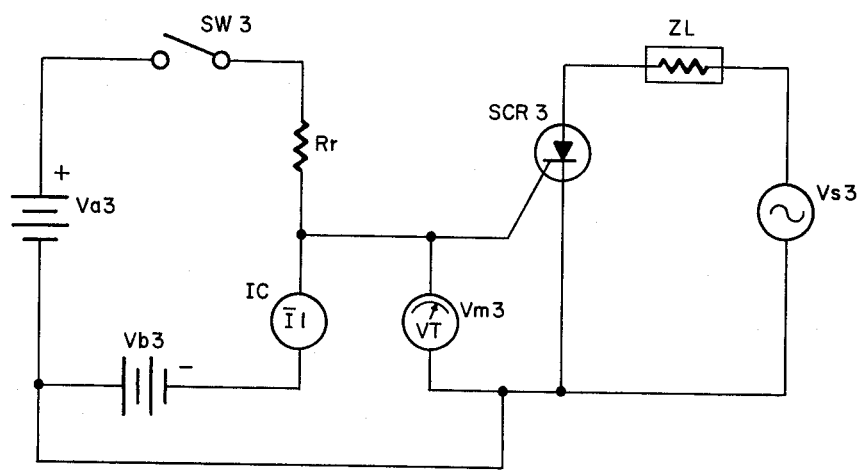
FIG. 7 illustrates schematically another embodiment of the invention.

Reference is made now to the schematic current illustration of another embodiment of the invention presented in FIG. 7. The operating circuit illustrates the broad principles of the invention and yet is least preferred in that it is considered to be less practical than the preferred embodiments previously described. Thus, a source of AC power Vs3 is connected in series with an electrical load ZL across the anode and cathode terminals of a thyristor SCR3 as in the previous embodiments. A first bias source, Va3, is connected in series with switch, SW3, and resistor, Rr, across the gate and cathode of the thyristor. A second polarity source, Vb3, is connected in series with a constant current generator IC between the thyristor gate and cathode. And a voltage monitoring and indicating device Vm3 is connected across the gate and cathode of the thyristor to provide an output signal or indication of the gate to cathode voltage. With switch SW3 open, interrupting the circuit to Va3, generator IC provides a reverse current through the gate to cathode junction and this current is of a constant level. Hence with SCR3 in the nonconducting state, the voltage across the base to cathode depends on the temperature dependent resistance and leakage of the junction; the current being constant, which may be read out or indicated on Vm3 as a temperature reading VT. Vm3 also may include an analog to digital converter. Closing switch SW3 connectes a forward bias to the gate, overriding the current from IC. With forward bias applied, SCR3 is switched on, conducting current through load ZL.

It is believed that the foregoing description of the preferred embodiments of the invention are sufficient in detail to permit one skilled in the art to make and use same. However, it is expressly understood that the details presented for the foregoing purpose are not to be considered as limiting the invention, inasmuch as various modifications and substitutions of equivalent elements as well as improvements become apparent to those skilled in the art upon reading this specification, all of which are within the scope of the disclosed invention. Accordingly, it is specifically requested that the invention be broadly construed within the full spirit and scope of the appended claims.

What is claimed is:

1. An electrical circuit comprising in combination:
   a semiconductor switch means having a control terminal and first and second main terminals;
   a first voltage source and an electrical load means connected in series circuit with said first and second main terminals;
   said semiconductor switch means for conducting current between its first and second terminals in said series circuit to supply current to said load responsive to said control terminal being forward biased relative to said first main terminal by a first polarity voltage and for exhibiting a junction temperature dependent current between its control terminal and its first main terminal responsive to said control terminal being reverse biased relative to said first main terminal by a second polarity voltage, which junction temperature dependent current and internal resistance thermal coefficient are a dependent function of junction temperature within the semiconductor means;

said circuit including a first circuit juncture, a second circuit juncture, a third circuit juncture and a fourth circuit juncture;

first resistance means and second resistance means connected in series circuit between said first and second circuit juncture; with said fourth circuit juncture being between said resistance means;

third resistance means connected in circuit between said first circuit juncture and said third circuit juncture; said control terminal of said semiconductor means being connected in common with said third circuit juncture; and said second circuit juncture being connected in common with said first main terminal of said semiconductor means to form a resistance bridge network containing in one arm thereof the control terminal to first main terminal and with said first and second junctures forming the bridge input and said third and fourth junctures forming a bridge output;

bias control means for applying, alternately, across said first and second circuit junctures a first polarity voltage to forward bias said control terminal of said semiconductor means relative to said first main terminal; and a second polarity voltage to reverse bias said control terminal of said semiconductor means relative to said first main terminal to derive a voltage between said third and fourth circuit juncture representative of the temperature of the junction in said semiconductor means during the period in which said second polarity voltage is applied.

2. The invention as defined in claim 1 wherein said semiconductor switch means comprises a thyristor having a gate control terminal, a first main or cathode terminal and a second main or anode terminal, and wherein said first voltage source comprises an AC voltage.

3. The invention as defined in claim 1 further comprising:
control means coupled to said third and fourth circuit juncture and to said bias control means for preventing said bias control means from applying said first polarity voltage during the time in which voltage appearing across said third and fourth juncture exceeds a predetermined level.

4. The invention as defined in claim 2 further comprising:
control means coupled to said third and fourth circuit juncture and to said bias control means for preventing said bias control means from applying said first polarity voltage during the time in which voltage appearing across said third and fourth circuit juncture exceeds a predetermined level.

5. The invention as defined in claim 1 further comprising:
indicator means responsive to said voltage across said third and fourth circuit juncture exceeding a predetermined level for providing an alarm indication.

6. The invention as defined in claim 1 further comprising: measuring means coupled across said third and fourth circuit juncture for providing a visible indication representative of the voltage level thereacross.

7. The invention as defined in claim 6 wherein said measuring means provides a visible indication representative of degrees of temperature.

8. The invention as defined in claim 1 further comprising:
operational amplifier means, said amplifier means having a reference input, an inverting input and an output;
fourth resistor means connected between said inverting input and said output for setting the gain of said amplifier;
fifth resistor means connected between said third circuit juncture and said inverting input; and
means connecting said reference input to said fourth circuit juncture, whereby said output of said amplifier provides a voltage representative of the voltage applied at said input.

9. The invention as defined in claim 8 wherein said first resistor means or said second resistor means includes a positionable tap and said positionable tap is connected in common with said circuit juncture.

10. The invention as defined in claim 1 further comprising a parallel combination of a resistor and capacitor connected in circuit between said second main terminal of said semiconductor switch means and said fourth circuit juncture for compensating for the effect of inherent leakage and capacitance between the second main terminal and the control terminal.

11. The invention as defined in claim 1 wherein said semiconductor switch means comprises a transistor.

12. The invention as defined in claim 6 wherein said measuring means provides a visible indication represented in terms of amps RMS.

13. The invention as defined in claim 1 wherein said electrical load means comprises means for converting electrical current into heat.

14. The method of determining the junction temperature of a semiconductor switch device of the type which conducts current between its first and second main terminals in a series currentconducting path, including an electrical source and a load, responsive to the control terminal thereof being forward biased relative to said first main terminal in a circuit including:
first bias means for applying an forward bias voltage through a first resistor means to said control terminal; and
second and third resistor means connected between said bias means and said first terminal; and
a source of current and an electrical load connected in series circuit connected across said main terminals of said semiconductor switch device, comprising the steps of:
interrupting said first bias means and substituting therefor a second bias means for applying a reverse bias voltage; and
measuring the voltage between said control terminal and a circuit juncture between said second and third resistor means.

15. An electrical circuit which includes in combination:
semiconductor switch means, said switch means being of the type which contains a control terminal, a first main terminal and a second main terminal, and responsive to forward biasing of the control terminal relative to said first main terminal to complete a conductive current-conducting path between said two main terminals, and said switch means further exhibiting a temperature dependent resistance effect between the control terminal and said first main terminal with the control terminal reverse biased relative to said first main terminal which effective resistance is dependent in level upon the temperature of the control terminal to first main terminal semiconductor junction;

means for connecting an electrical circuit, including electrical load and a power source in series, between said first and second main terminals;

first resistor means;

second resistor means and third resistor means;

bias control means having an output for providing a first polarity voltage at the output in a first condition and for providing, alternately, a second polarity voltage at the output in a second condition;

said semiconductor switch means control terminal being forward biased when coupled to said first polarity voltage and being reversed biased when coupled to said second polarity voltage;

said first resistor means being connected between said output of said bias control means and said control terminal of said semiconductor switch means;

said second and third resistor means being connected in series circuit between said output of said bias control means and said first main terminal of said semiconductor switch means to derive a voltage between the control terminal of said semiconductor switch means and the circuit juncture of said second and third resistor means, which voltage is representative of semiconductor junction temperature when said bias control means is in its second condition; and voltage monitoring means coupled in circuit between said control terminal and a circuit juncture between said second and third resistor means for monitoring said derived voltage.

16. The invention as defined in claim 15 further comprising:

resistor means and capacitor means connected in parallel between said circuit juncture of said second and third resistor means and said second main terminal of said semiconductor switch means to balance any inherent capacitance and leakage effects in said semiconductor switch means between said control terminal and said second main terminal thereof.

17. The invention as defined in claim 15 wherein said voltage monitoring means comprises further: indicator means for continuously representing the level of said monitored voltage in terms of predetermined units of value.

18. The invention as defined in claim 17 wherein said units of value comprises volts.

19. The invention as defined in claim 17 wherein said units of value comprises amperes RMS.

20. The invention as defined in claim 17 wherein said units of value comprises degrees of temperature.

21. The invention as defined in claim 15 wherein at least second and third resistance means includes adjusting means for adjusting the resistances thereof.

22. The invention as defined in claim 15 wherein said voltage monitoring means comprises further: alarm means for indicating the level of voltage monitored has exceeded a desired maximum level.

23. The invention as defined in claim 15 wherein said semiconductor switch means comprises a thyristor.

24. The invention as defined in claim 15 wherein said semiconductor switch means comprises a transistor.

25. The invention as defined in claim 15 wherein said semiconductor switch means comprises a silicon controlled rectifier.

26. The invention as defined in claim 15 wherein said bias control means includes means for periodically alternating the condition of said bias control means between its first and second condition, and comprising further inhibit means for retaining said bias control means in its said second condition responsive to said voltage monitoring means detecting a voltage exceeding a predetermined limit.

27. The invention as defined in claim 15 wherein said bias control means includes:

means for periodically alternating the condition of said bias control means between the first and second condition thereof, whereby said control terminal of said semiconductor switch means is periodically and alternately forward biased and reverse biased;

said wherein said invention comprises further:

inhibit means coupled to said voltage monitoring means and to said bias control means for retaining said bias control means in its said second condition responsive to said voltage monitoring means attaining a predetermined output level representative of a juncture temperature limit, and maintaining said bias control means in such second condition subsequently until said output of said voltage monitoring means decreases a predetermined increment from said predetermined output level.

28. The invention as defined in claim 27 further comprising:

resistor means and capacitor means connected in parallel between said circuit juncture of said second and third resistor means and said second main terminal of said semiconductor switch means to balance any inherent capacitance and leakage effects in said semiconductor switch means between said control terminal and said second main terminal thereof.

29. The invention as defined in claim 26 further comprising means for coupling heat generated in said load to said semiconductor switch means.

30. In an electrical circuit for supplying current to a load, the combination comprising:

thyristor means having a gate, anode, and cathode; said anode and cathode connected in a series electrical circuit that includes an electrical load and a source of AC power;

said thyristor means being of the type which conducts current in a direction from its anode to cathode only in response to a first polarity voltage applied to said gate to forward bias said gate and restores to a nonconductive state when the current in that direction reduces to zero, and being reverse biased by a second polarity voltage applied to said gate;

said source of AC power being of the type that supplies a cyclically time varying voltage having in each cycle a first polarity over a first time interval and a second polarity over a second time interval appearing at said anode;

first means having an output and having an input, said first means for normally providing a second polarity voltage to said output and responsive to a trigger input signal at said input for providing a first polarity voltage pulse to said output;

first resistor means connected between said output of said first means and said gate;

second resistor means and third resistor means connected electrically in series between said output of said first means and said cathode;

second means having an input coupled between said gate and a circuit juncture between said second and third resistor means for monitoring the voltage thereacross and for providing at an output a signal representative of the voltage applied to said input;

third means for providing a signal at an output representative of the lapse of time from the commencement of the said first time interval to the end thereof in each cycle;

fourth means coupled to the output of said second means and the output of said third means for gating a trigger signal to the input of said first means responsive to said output signals attaining a predetermined relationship during said first time interval.

31. The invention as defined in claim 30 further comprising:

fifth means for providing pulses at an output, each of said pulses representative of a command to switch said thyristor means into the electrically conductive state;

sixth means responsive to receipt of said pulse from said fifth means for providing a triggering signal at an output for the duration of said first time interval;

seventh circuit means for coupling said output of said sixth means to said fourth means for supplying the triggering signal coupled to said first means by said fourth means.

32. The invention as defined in claim 31 wherein said fourth means includes:

comparator means for providing an output responsive to the voltage at one input exceeding the voltage at a second input; one of said inputs being connected to the output of said second means and the other input connected to the output of said third means;

inhibit switch means coupled at an enabling input to said comparator means for coupling an input to an output responsive to an output from said comparator means, said input connected to said output of said sixth means and said output coupled to the input of said first means.

33. The invention as defined in claim 30 wherein said second means includes:

operational amplifier means for providing an output only when the level of voltage at its input attains a predetermined maximum level.

34. The invention as defined in claim 30 wherein said second means includes:

operational amplifier means for providing an output directly representative of the voltage at its input within a predetermined range of input voltages.

35. The invention as defined in claim 31 further comprising:

eighth means responsive to AC voltage across said anode and cathode of said thyristor means for providing a squarewave voltage of the same periodicity of said AC and 180 degrees out of phase therewith;

ninth means for coupling the output of said eighth means to said third means for synchronizing said third means;

tenth means for coupling the output of said eighth means to said sixth means for disabling said sixth means during the intervals in which the polarity of said squarewave is of a first polarity.

36. The invention as defined in claim 31 wherein said sixth means comprises:

flip-flop type bistable switch means, said flip-flop means normally in a first bistable state, when enabled, and switchable to a second bistable state when triggered at an input.

37. The invention as defined in claim 35 wherein said third means comprises:

ramp voltage generator means for providing a linearly increasing voltage at an output during the presence of a constant voltage of a second polarity applied at an input;

whereby said eighth means supplies a constant voltage of a second polarity during each said first time interval.

38. The invention as defined in claim 30 wherein said electrical load means comprises resistance welding means.

39. The invention as defined in claim 30 further comprising a resistor and a capacitor connected in parallel circuit between a circuit juncture between said second and third resistor means and said anode to compensate for any anode to gate leakage resistance and capacitance characteristic of said thyristor.

40. The invention as defined in claim 30 further comprising means coupling heat generated by said load to said thyristor.

41. In a circuit for providing current to a load from a source of AC power, the combination comprising:

thyristor having a gate, cathode and anode, said thyristor being of the type which is responsive to a forward bias voltage applied to its gate switches from a normally non-conducting state to a current-conducting state permitting passage of current between its cathode and anode and which upon the reduction of current to zero restores to the noncurrent-conducting condition and remains until retriggered by reapplication of forward bias voltage at said gate, said thyristor being connected in an electrical series circuit including said source of power and said load;

a first circuit juncture;

first resistor means and second resistor means connected in electrical series circuit between said circuit juncture and said cathode;

third resistor means connected between said circuit juncture and said gate;

firing circuit means having an output coupled to said first circuit juncture for normally applying a second polarity voltage to said circuit juncture to reverse-bias said gate and, alternately, responsive to a signal at its input for providing a first polarity pulse to said juncture to forward bias said gate;

squarewave generator means having an input coupled across said thyristor for providing at an output an alternating squarewave voltage alternating between a first and second polarity over first and second intervals and 180 degrees out of phase with said input AC voltage and of the same frequency;

flip-flop switch means having first and second stable output conditions, said switch means having a reset input, a trigger input and an output and responsive to a reset voltage of a first polarity at said reset input for providing a first output condition and responsive to a subsequent signal to the trigger input for providing a second output condition;

said reset input being coupled to the output of said squarewave generator means;

a source of command signal pulses for providing pulses to said trigger input of said flip-flop;

inhibit switch means having a first input connected to the output of said flip-flop switch means, and an output connected to the input of said firing circuit means for coupling the output of said flip-flop switch means to said firing circuit responsive to a signal at a control input;

ramp voltage generator means coupled to said squarewave generator means for generating a voltage having a ramplike waveshape over an interval corresponding to the squarewave voltage being at a second polarity and providing such ramp voltage at an output;

voltage monitoring means having an input coupled between said gate and a circuit juncture between said first and second resistance means for monitoring the voltage appearing thereacross and providing a voltage representative of said monitored voltage at an output;

comparator means having first and second inputs connected respectively to the outputs of said ramp voltage generator means and said voltage monitoring means for providing an output responsive to the voltage at said first input exceeding the voltage at said second input; and means coupling the output of said comparator means to said control input of said inhibit switch;

whereby if the voltage input to said voltage monitoring means representative of said thyristor junction temperature exceeds a predetermined level as compared to the voltage of said ramp generator as a reference, said inhibit switch prevents operation of said firing circuit, irrespective of the state of said flip-flop switch means, until said voltage falls to a lower level, wherein firing of said thyristor may be delayed for a portion of an AC half cycle or one or more AC half cycles.

42. The invention as defined in claim 41 further comprising a resistor and capacitor connected in parallel circuit between said anode and a circuit juncture between said first and second resistance means to compensate for any anode to gate leakage resistance and capacitance characteristic of said thyristor.

43. The invention as defined in claim 42 further comprising means for coupling heat generated in said load to said thyristor.

44. An electrical circuit for providing current to an electrical load including in combination:

semiconductor switch means, said switch means being of the type which contains a control terminal, a first main terminal and a second main terminal, and responsive to forward biasing of the control terminal relative to said first main terminal to complete a conductive current conducting path between said two main terminals, and said switch means further exhibiting a resistance effect between the control terminal and the first main terminal with the control terminal reverse-biased relative to said first main terminal which effective resistance is dependent in level upon the temperature of the control terminal to first main terminal semiconductor junction;

means connecting a power source and an electrical load means in series across the first and second main terminals;

first source means for providing a forward bias voltage;

second source means for providing a reverse bias voltage;

switch means for alternately applying a forward bias voltage and a reverse bias voltage to said conrol terminals of said semiconductor switch means;

voltage monitoring means for providing an output representative of the control terminal to first main terminal resistance effect responsive to said semiconductor switch means being in the nonconductive condition and said switch means applying a reverse bias to said control terminal.

45. The invention as defined in claim 44 wherein said second source means includes constant current means for providing a reverse bias current of a constant level.

46. The invention as defined in claim 44 wherein said voltage monitoring means includes an input coupled between said control terminal and said first main terminal.

47. The invention as defined in claim 44 wherein said semiconductor switch means comprises a thyristor.

48. The invention as defined in claim 44,
including constant current generating means coupled in series with said second source means and said series circuit coupled across said control terminal to first main terminal of said semiconductor switch means for driving a reverse current of a constant level therethrough;

and further including resistor means connected in series with said first source means across said control terminal to first main terminal for applying a forward bias to said control terminal sufficient to override said reverse bias;

and wherein said voltage monitoring means has an input coupled between said control terminal and first main terminal responsive to the voltage thereacross.

* * * * *